(12) United States Patent
Kantorovich et al.

(10) Patent No.: US 6,879,178 B1
(45) Date of Patent: Apr. 12, 2005

(54) MEASURING CURRENT ON A DIE

(75) Inventors: Isaac Kantorovich, Chestnut Hill, MA (US); Christopher Lee Houghton, Westborough, MA (US); James J. St. Laurent, Oakham, MA (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 0 days.

(21) Appl. No.: 10/745,101

(22) Filed: Dec. 22, 2003

(51) Int. Cl.[7] .................. G01R 31/28; G01R 19/00
(52) U.S. Cl. ................. 324/765; 324/158.1; 702/64
(58) Field of Search .................. 324/765, 132, 324/142, 158.1, 760; 702/60, 61, 64, 65

(56) References Cited

U.S. PATENT DOCUMENTS

| | | | |
|---|---|---|---|
| 4,630,228 A | * 12/1986 | Tarczy-Hornoch et al. ... 702/59 |
| 5,461,329 A | * 10/1995 | Linehan et al. ............. 324/772 |
| 5,483,170 A | * 1/1996 | Beasley et al. ............. 324/537 |
| 5,963,038 A | 10/1999 | De Jong et al. |
| 6,002,264 A | 12/1999 | Gilbert et al. |
| 6,239,587 B1 | 5/2001 | Buck |
| 6,337,571 B1 | 1/2002 | Maddala et al. |
| 6,518,782 B1 | 2/2003 | Turner |

* cited by examiner

*Primary Examiner*—Ernest Karlsen

(57) ABSTRACT

Disclosed are various systems, methods, and programs embodied in computer readable mediums for measuring current in a central processor unit (CPU) package. To measure the current, a voltage V(t) is determined in situ across at a power input of a die in the CPU package while running a computer process on the die. Then, the Fourier transform of the voltage $F_f(V(t))$ is calculated from the voltage V(t). The current at the power input of the die in the frequency domain $(F_f(I_{dd}(t)))$ can then be calculated from the voltage $F_f(V(t))$ and impedance $Z_f$, where the impedance $Z_f$ comprises an impedance of a power supply loop coupled to the power input as a function of frequency. Finally, the current $I_{dd}(t)$ at the power input of the die is determined in the time domain by calculating the inverse Fourier transform of the current in the frequency domain $F_f(I_{dd}(t))$.

19 Claims, 7 Drawing Sheets

MEASURING CURRENT ON A DIE

BACKGROUND

Development of microprocessor technology has seen decreasing power supply voltages that are more susceptible to interference by noise, decreasing signal transition times, decreasing die sizes, increasing power supply currents, and increasing clock speeds. As a result, ever more significant demands are placed upon the power supplies of microprocessor circuits. Such demands typically result in significant current variation between power and ground conductors.

Knowledge as to the nature of the variation in current from a power supply due to the operation of a microprocessor is useful for predicting signal integrity in a microprocessor. This is because the noise that is injected onto a power supply loop due to the change in the current demanded by the microprocessor is proportional to the rate of the change in the current. Consequently, actual knowledge as to the variation in the current can be important to verify the worst case system power supply loop response.

However, there are significant obstacles that prevent a direct measurement of current supplied to a microprocessor circuit. For example, the measurement of the supply current has to be performed while the microprocessor is under operating conditions. Under these conditions, the die and package are typically not separated, so a probe used for measurement can not be attached to the power and ground at the die. Also, equipment used to measure the current itself may further distort the current, thereby resulting in inaccurate results. As a result, it is difficult to measure actual current supplied to the die under operating conditions to confirm the accuracy of the modeling of such current during design of the microprocessor and the power supply.

BRIEF DESCRIPTION OF THE DRAWINGS

The various embodiments of the invention can be understood with reference to the following drawings. The components in the drawings are not necessarily to scale. Also, in the drawings, like reference numerals designate corresponding parts throughout the several views.

DETAILED DESCRIPTION

Figure 1:
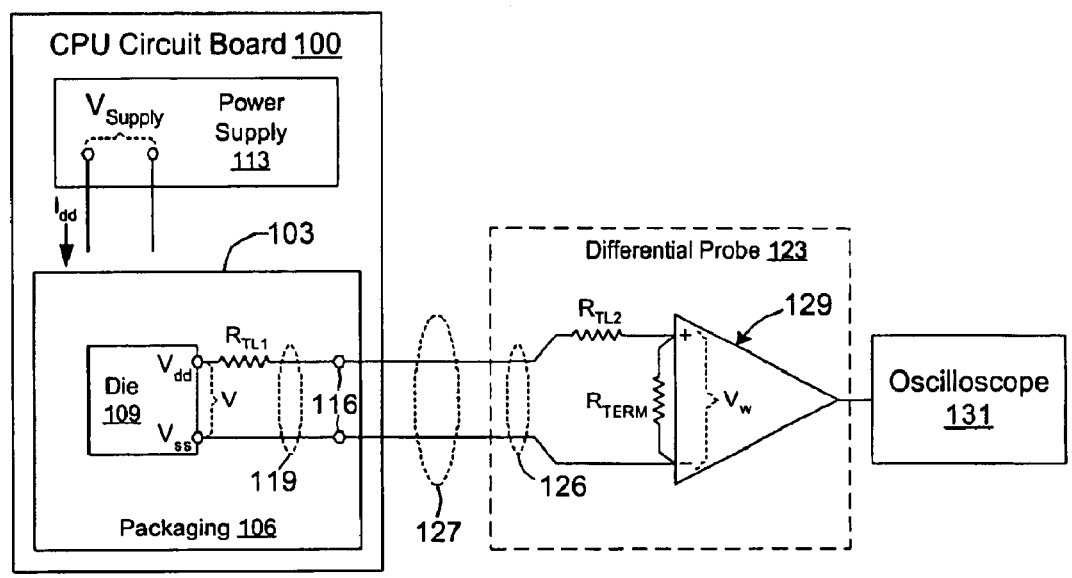
FIG. 1 is a schematic block diagram of a circuit board having a central processing unit comprising a semiconductor package and a die that is coupled to a power supply that generates a current that is measured according to the various embodiments of the present invention.

With reference to FIG. 1, shown is a schematic block diagram of a central processing unit (CPU) circuit board 100 upon which is mounted a CPU package 103. The CPU package 103 comprises packaging 106 and at least one semiconductor die 109. In addition, a power supply 113 is also included on the CPU circuit board 100. In other embodiments, the power supply 113 may be located within the CPU package 103. The power supply 113 may be, for example, a voltage regulator or other appropriate device or circuit as can be appreciated by those with ordinary skill in the art. The power supply 113 generates voltage $V_{Supply}$ and current $I_{dd}$ that flows to the die 109. The CPU package 103 includes test points 116 that allow the voltage V to be measured across the voltage $V_{dd}$ and the common $V_{ss}$ during operation of the die 109 itself.

The power supply 113 supplies system voltage $V_{Supply}$ to the die 109 during operation of the die 109. In this respect, a power supply loop exists that includes the power supply 113 and the conductors that couple the power supply 113 to the power input of the die 109. Such conductors may include, for example, a ground plane (i.e. solid or grid), a power plane (i.e. solid or grid), vias, traces, coupling capacitors, bumps, and/or other elements. The voltage V is seen at a power input of the die 109, where $V=V_{dd}-V_{ss}$. In this respect, the voltage V may not equal the voltage $V_{Supply}$ due to the impedance in the conductors between the power supply 113 and the power input of the die 109 and due to other circumstances as can be appreciated by those with ordinary skill in the art. The power supply 113 may also provide voltage and current to other components (not shown) in the packaging 106 and on the CPU circuit board 100.

In order to allow a user to measure the voltage V across $V_{dd}$ and $V_{ss}$, conductors are provided that link $V_{dd}$ and $V_{ss}$ to the test points 116. These conductors make up a transmission line 119 between the voltage V input of the die 109 to the test points 116. The transmission line 119 includes resistance $R_{TL1}$.

A differential probe 123 is employed to obtain a measure of the voltage V. The differential probe 123 includes cables that make up a transmission line 126 that is coupled to the inputs of a comparator 129. The transmission line 126 includes resistance $R_{TL2}$. The transmission line 126 is configured to contact the test points 116 on the CPU package 103. Together, the transmission lines 119 and 126 make up a transmission line 127 between the power input of the die 109 and the inputs of the comparator 129 of the differential probe 123. In this respect, the resistance of the transmission line 127 is noted as $R_{TL}$ which is the sum of the resistances $R_{TL1}$, and $R_{TL2}$. In this respect, the characteristic impedance of the transmission lines 119 and 126 are matched so as to minimize reflections at the junction between the transmission lines 119 and 126 as can be appreciated.

The differential probe 123 may include a terminal resistance $R_{TERM}$ that is coupled across the inputs to the comparator 129. The output of the differential probe 123 is applied to an oscilloscope 131 to view the resulting waveform. A voltage $V_w$ is specified as the voltage across the terminal resistor $R_{TERM}$ that is input into the comparator 129.

The differential probe 123 is employed, for example, to measure the voltage V at the power input of the die 109. The resistance of the termination resistance $R_{TERM}$ is calculated so as to minimize reflection of the voltage signals reaching the comparator 129. However, given that such reflections are generally of high frequency, the termination resistance $R_{TERM}$ may not be necessary if high frequency reflections or noise is of no concern. In such a case, the high frequency noise may be filtered out of the signal obtained as will be described. To measure the voltage V, the transmission line 126 is coupled to the test points 116. In the case that the termination resistance $R_{TERM}$ is employed, the voltage $V_w$ is measured over a period of time ($V_w(t)$) and is stored in a memory associated, for example, with the oscilloscope 131. The voltage V(t) may then be calculated from the voltage $V_w(t)$, the termination resistance $R_{TERM}$, and the transmission line resistance $R_{TL}$ of the transmission line 127.

If the termination resistance $R_{TERM}$ is not employed, then the voltage V may be measured and stored as a function of time (V(t)) in a memory associated, for example, with the oscilloscope 131. In such case, it is assumed that the voltage V(t) is the same as the voltage $V_w(t)$ measured across the inputs of the comparator 129 since the comparator 129 includes a near infinite input resistance and there is negligible current on the transmission line 127. The voltage V(t) may be stored, for example, on a computer readable medium that is accessed for further analysis and calculation as will be discussed. In addition, the voltage V(t) may be subjected to filter to eliminate or minimize any unwanted high frequency components when the voltage V(t) is measured without the termination resistance $R_{TERM}$.

Figure 2A:
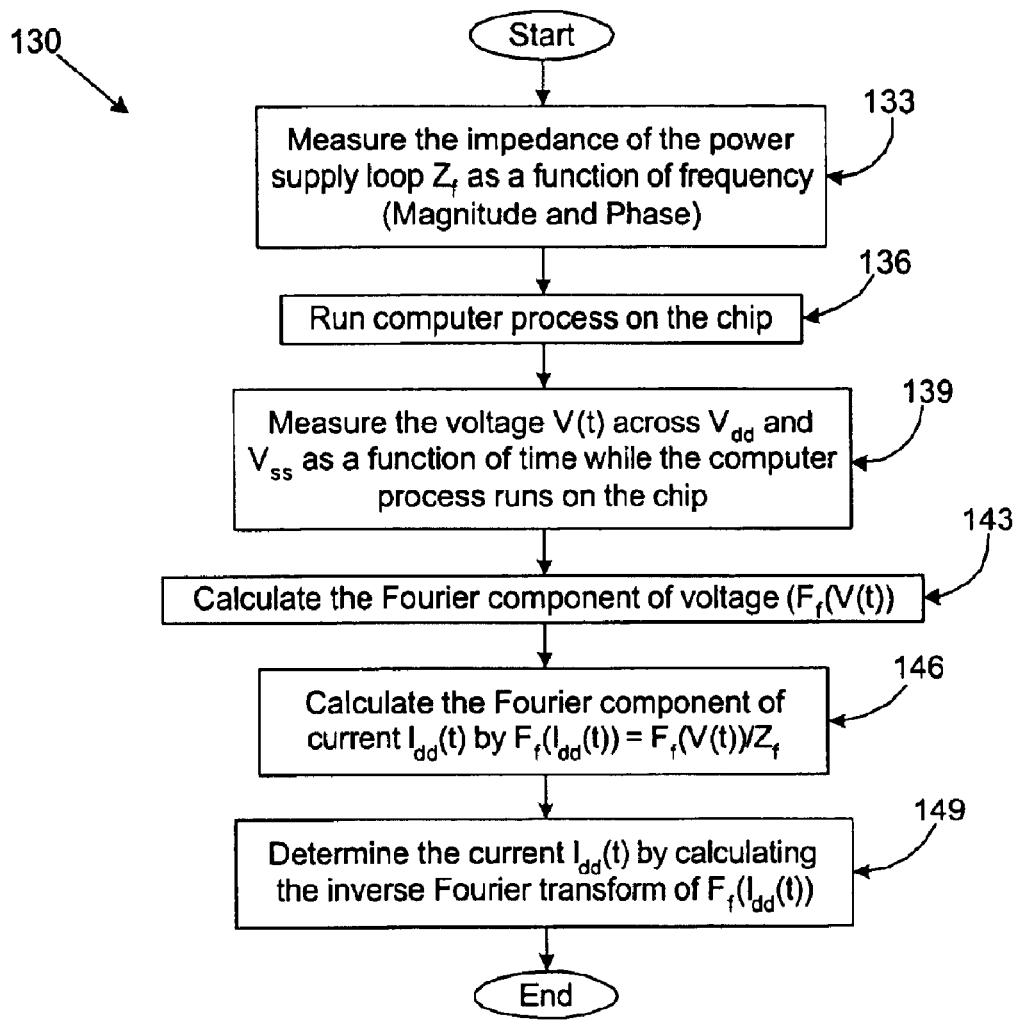
FIG. 2A is a flow chart of an example of a method for determining a current supplied to the die by the power supply of FIG. 1 according to an embodiment of the present invention.

Turning then, to FIG. 2A, shown is a flow chart of one example of a method 130 for obtaining a measure of the current $I_{dd}(t)$ (FIG. 1) as a function of time according to an embodiment of the present invention. Beginning with step 133, first the impedance of the power supply loop as a function of frequency is obtained. In this respect, the impedance is denoted as $Z_f(\omega)$ herein and includes magnitude and phase. In order to determine impedance $Z_f(\omega)$, reference is made, for example, to the approaches described in U.S. Patent Application Publication No. 2004/0075451 entitled "System and Method of Measuring Low Impedance" filed on Oct. 21, 2002 and assigned Ser. No. 10/274,611, and U.S. Patent Application Publication No. 2004/0078156 entitled "System and Method of Measuring Low Impedances" filed on Oct. 21, 2002 and assigned Ser. No. 10/274,787, both of which are incorporated herein by reference. Alternatively, the impedance $Z_f(\omega)$ of the power supply loop may be ascertained using other approaches as can be appreciated by those with ordinary skill in the art.

Once the impedance $Z_f(\omega)$ is obtained in box 133, then in box 136 a predefined computer process is run or executed on the die 109 (FIG. 1). The predefined computer process may be code that, when executed, implements various functions of the die 109. Specifically, given that the circuitry of the die 109 comprises a processor circuit, then the computer process that comprises predefined test code is loaded into a memory portion of the die 109 and is executed thereby to create the conditions in which the current $I_{dd}$ includes noise due to the rate of change of the current as a result of the fluctuating load presented by the execution of the computer process.

Then, in box 139, the voltage V(t) is measured with the differential probe 123 and is stored for future use. In this respect, the transmission line 126 (FIG. 1) is coupled to the test points 116, thereby creating the transmission line 127 (FIG. 1) between the inputs of the comparator 129 and the power input of the die 109. The voltage V(t) is measured in situ while the die 109 is operation. To measure the voltage V(t), the termination resistance $R_{TERM}$ (FIG. 1) may or may not be used. If the termination resistance $R_{TERM}$ is not employed, then additional high frequency noise may be detected in the voltage V(t). However, such high frequency noise may not be of a concern if one wishes to determine the low frequency characteristics of the voltage V(t). Consequently, the waveform of the voltage V(t) may be filtered to remove any unwanted high frequency components. Alternatively, the termination resistance $R_{TERM}$ may be employed to minimize unwanted reflections that may occur in the transmission line 127 (FIG. 1) of the differential probe 123 (FIG. 1) as will be discussed.

Once the voltage V(t) has been measured and stored in box 139, then in box 143 the Fourier transform of the voltage V(t) is calculated. The Fourier transform of the voltage V(t) is denoted herein as $F_f(V(t))$. In this respect, a Fourier transform operation may be performed on the data that represents the voltage V(t) determined in box 139. Thereafter, in box 146, the Fourier component of the current $I_{dd}(t)$ is calculated from the Fourier transform $F_f(V(t))$ of the voltage V(t) and the impedance $Z_f(\omega)$. In this respect, the Fourier component of the current $I_{dd}(t)$ may be calculated using the following equation $$F_f(I_{dd}(t)) = F_f(V(t))/Z_f$$

or its mathematical equivalent. To the extent that the voltage V(t) has been filtered to remove any high frequency components, before the calculation of $F_f(I_{dd}(t))$ above, the same high frequency components should be removed from the impedance $Z_f(\omega)$. Then, in box 149, the current $I_{dd}(t)$ is determined by calculating the inverse Fourier transform of the Fourier component of the current $F_f(I_{dd}(t))$. The data that represents the current $I_{dd}(t)$ may then be stored and analyzed accordingly. Thereafter, the method 130 ends as shown.

The approach employed above to determine the current $I_{dd}(t)$ is advantageous as it is determined "in situ" as it is derived from the data representing the voltage V(t) that was measured during the execution of the computer process by the die 109. In this respect, the measurement of the current $I_{dd}(t)$ is non-intrusive in that measuring equipment does not unacceptably alter or distort the voltage V(t) during the operation of the die 109. Consequently, a relatively accurate measure of the current $I_{dd}(t)$ may be obtained without unacceptable distortion in the current $I_{dd}(t)$ itself. Ultimately, the measurement of $I_{dd}(t)$ may be compared with the modeled current to verify that the electrical load represented by the die 109 is within design limits.

Figure 2B:
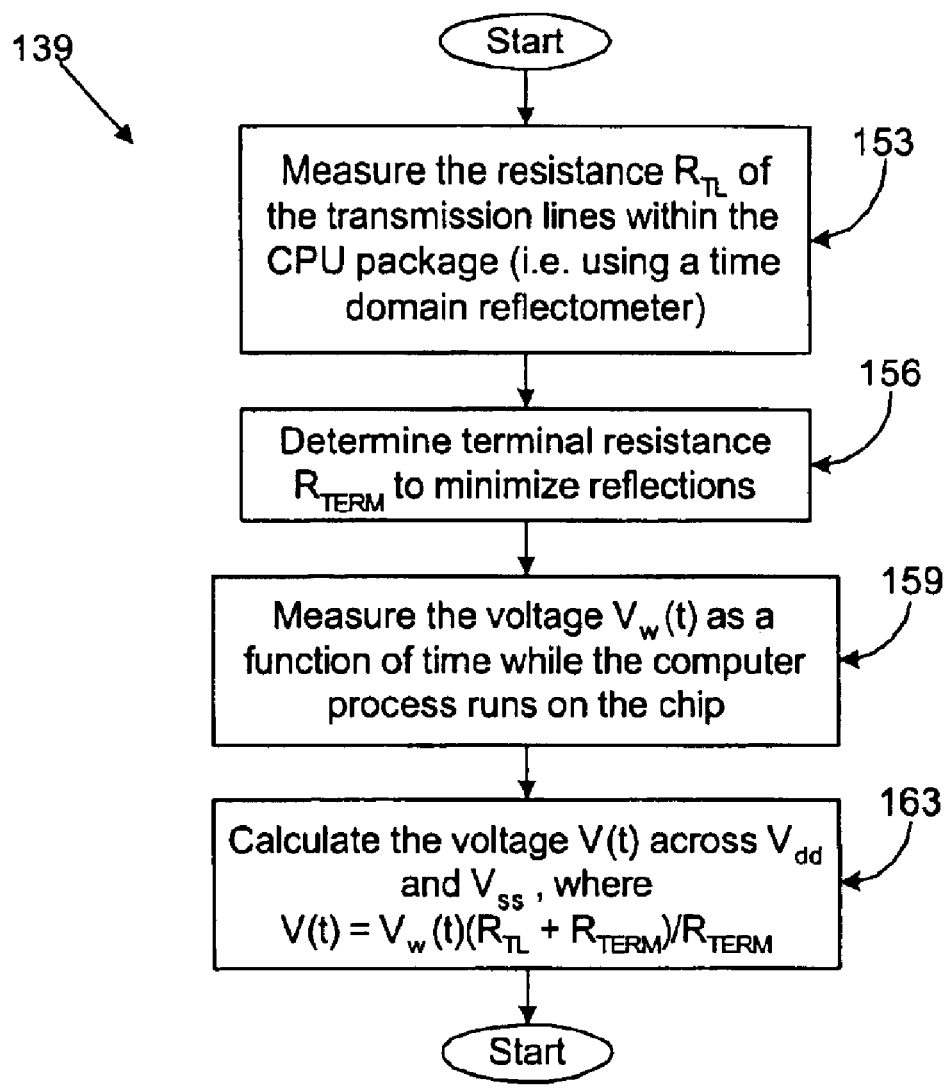
FIG. 2B is a flow chart of an example of one method for determining a voltage supplied to the die by the power supply of FIG. 1 as a portion of the method of FIG. 2A according to an embodiment of the present invention.

Referring next to FIG. 2B, shown is a flow chart of one example of a method to measure the voltage V(t) (FIG. 1) across the test points 116 (FIG. 1) as described in step 139 (FIG. 2A) in a manner that minimizes reflections in the transmission line 127 according to an embodiment of the present invention. Beginning with step 153, a measure of the resistance $R_{TL}$ of the transmission line 127 is obtained. The resistance $R_{TL}$ of the transmission line 127 may be obtained, for example, using a time domain reflectometer or using other approaches as can be appreciated by those with ordinary skill in the art. The resistance $R_{TL}$ is equal to the sum of the resistance $R_{TL}$ of the transmission line 119 and the resistance $R_{TL2}$ of the transmission line 126 as described above.

Then, in step 156, the terminal resistance $R_{TERM}$ that is to be applied across the inputs of the comparator 129 of the differential probe 123 as shown is calculated so as to minimize reflections in the transmission line 127 of the differential probe 123. Next in step 159, the voltage $V_w(t)$ (FIG. 1) is measured in situ for a predefined period of time while the computer process runs on the die 109 (FIG. 1) as was initiated in step 136. In particular, the transmission line 126 is coupled to the test points 116 and measurements of the voltage $V_w(t)$ are taken while running the computer process on the die 109 (FIG. 1). Thereafter, in step 163, the voltage V(t) is calculated from the probe voltage $V_w(t)$, the termination resistance $R_{TERM}$, and the transmission line resistance $R_{TL}$. In this respect, V(t) may be calculated using the following equation $$V(t)=V_w(t)(R_{TL}+R_{TERM})/R_{TERM}$$

or its mathematical equivalent. Once calculated, the voltage V(t) may be employed to determine the current $I_{dd}(t)$ as described with reference to FIG. 2A. Thereafter, the method 139 ends as shown.

The voltage V(t) derived as described above may include some degree of error due to reflections that occur despite the use of the termination resistance $R_{TERM}$. However, to the extent that the termination resistance $R_{TERM}$ is properly calculated, the degree of error may be minimized such that an acceptable measure of the voltage V(t) is obtained.

Figure 3:
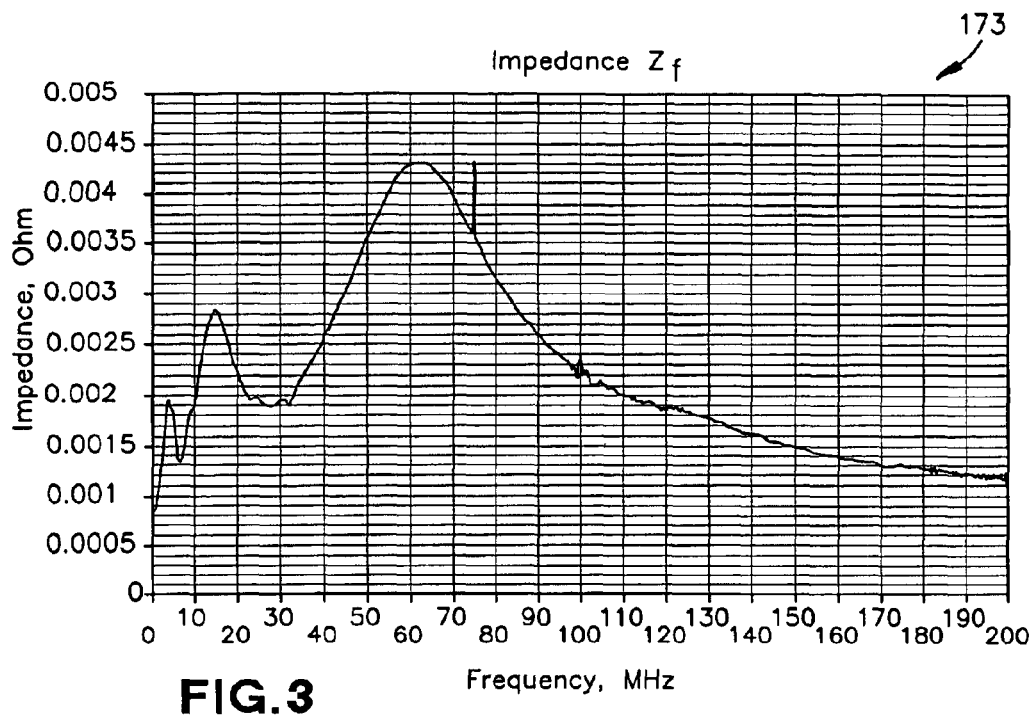
FIG. 3 is a graph that illustrates an example of the impedance of a power supply loop associated with the central processing unit circuit board of FIG. 1 as a function of frequency as employed according to various embodiments of the present invention.
Figure 4:
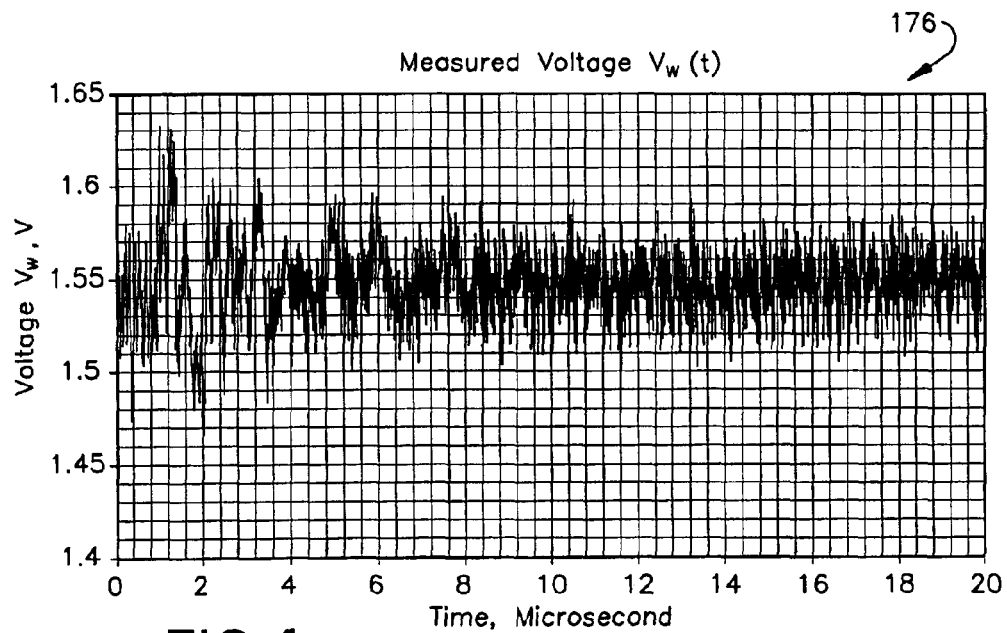
FIG. 4 is a graph that illustrates one example of a measured voltage supplied to the die by the power supply of FIG. 1.
Figure 5:
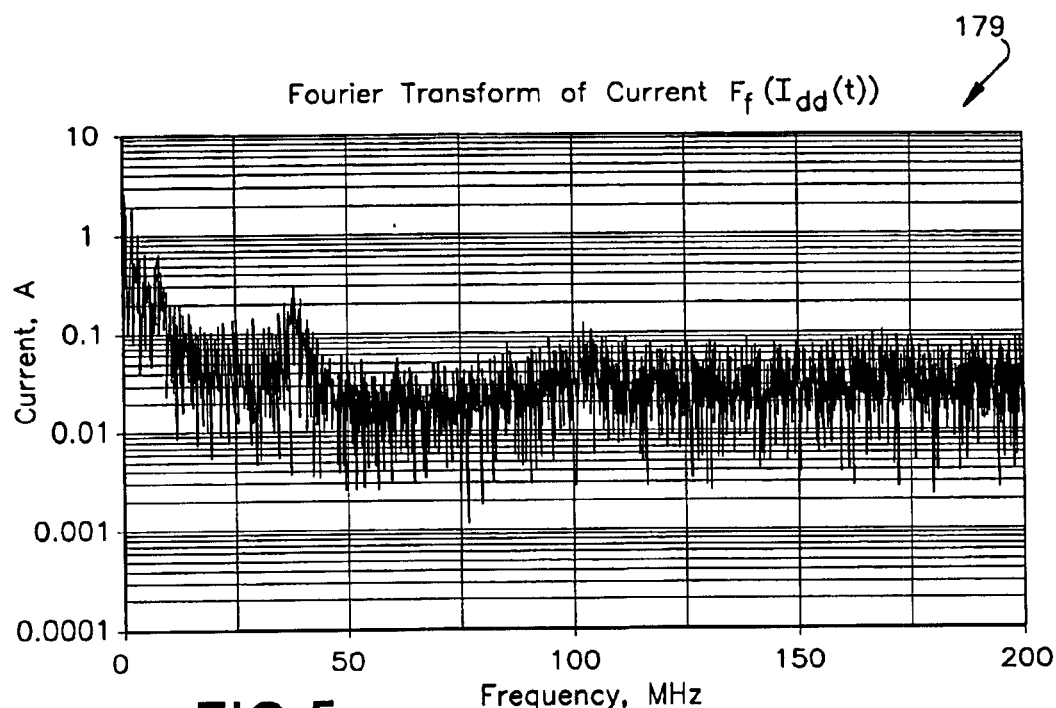
FIG. 5 is a graph that illustrates one example of a Fourier transform of the current supplied to the die by the power supply of FIG. 1 calculated according to various embodiments of the present invention.
Figure 6:
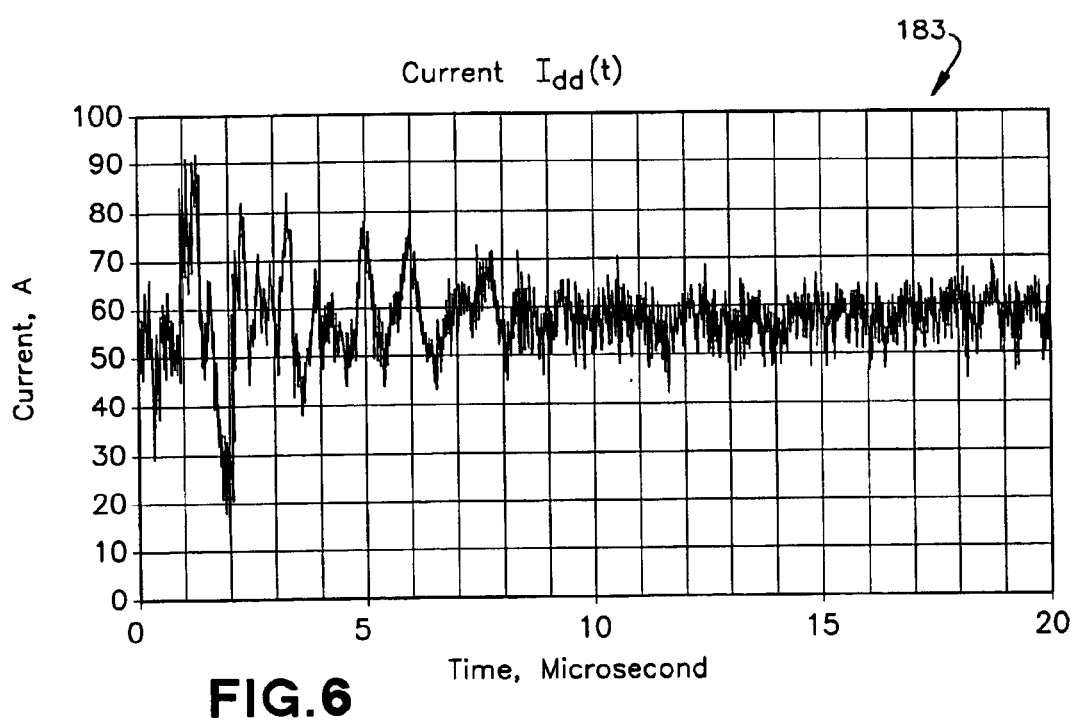
FIG. 6 is a graph of an example of the current determined by taking an inverse Fourier transform of the Fourier transform of the current illustrated in the graph of FIG. 5 according to an embodiment of the present invention.

Referring next to FIGS. 3–6, shown are various graphs that illustrate examples of measure quantities as described above. FIG. 3 is a graph 173 that provides one example of the impedance $Z_f(\omega)$ of a power supply loop measured as described above for specific die 109. As shown, the impedance $Z_f(\omega)$ varies significantly across the frequency spectrum shown. FIG. 4 is a graph 176 that provides one example of the voltage $V_w(t)$ measured as described above. In the specific measurement of $V_w(t)$ shown is FIG. 4, the termination resistance $R_{TERM}$ of the differential probe 123 (FIG. 1) employed was 100 Ohms and the transmission line resistance $R_{TL}$ was measured to be 7 Ohms. Ultimately, the voltage V(t) is calculated from the data represented the voltage $V_w(t)$ as depicted. FIG. 5 is a graph 179 that provides one example of the Fourier transform of the current $F_f(I_{dd}(t))$ calculated from the Fourier transform of the voltage $F_f(V(t))$ divided by the impedance $Z_f(\omega)$. FIG. 6 is a graph 183 that illustrates an example of the current $I_{dd}(t)$ that is obtained by calculating the inverse Fourier transform of the current $F_f(I_{dd}(t))$ displayed in FIG. 5.

Figure 7:
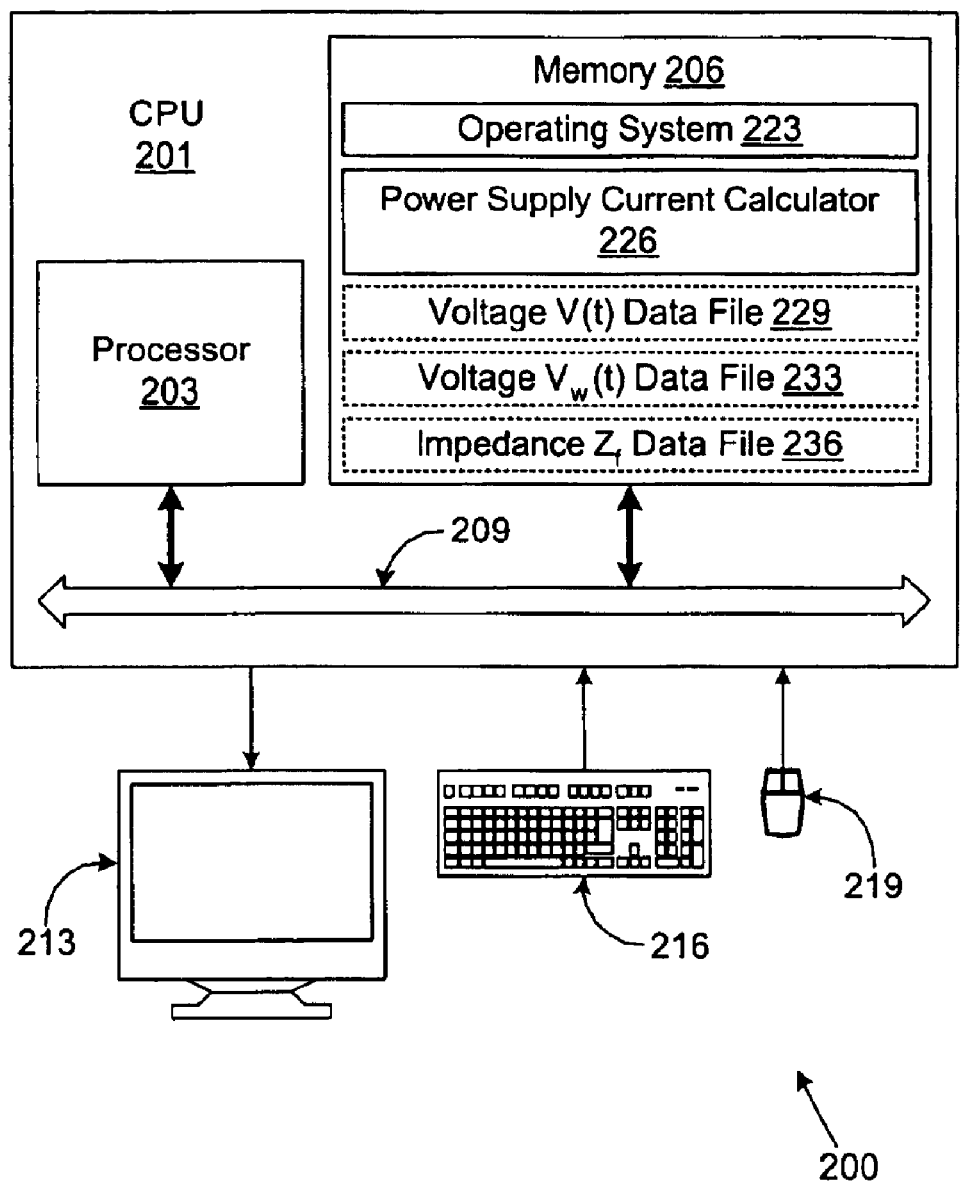
FIG. 7 is a schematic block diagram of an example of a computer system that is employed to execute a power supply current calculator to determine the current supplied to the die by the power supply of FIG. 1 according to an embodiment of the present invention.

With reference to FIG. 7, shown is a schematic block diagram of a computer system 200 according to an embodiment of the present invention. The computer system 200 may be, for example, a desktop, laptop, personal digital assistant, or other system with like capability. In this respect, the computer system 200 includes a central processing unit 201 having a processor circuit having a processor 203 and a memory 206 that are both coupled to a local interface 209. The local interface 209 may be, for example, a data bus with an accompanying control/address bus as can be appreciated by those with ordinary skill in the art. As an alternative, the processor circuit may be included within the oscilloscope 131 or other device as can be appreciated.

The computer system 200 includes peripheral devices such as, for example, a display device 213, a keyboard 216, and a mouse 219. In addition, the computer system 200 may also include other peripheral devices not shown such as, for example, a keypad, touch pad, touch screen, microphone, scanner, joystick, or one or more push buttons, etc. The peripheral devices may also include indicator lights, speakers, printers, etc. The display device 213 may be, for example, cathode ray tubes (CRTs), liquid crystal display screens, gas plasma-based flat panel displays, or other types of display devices, etc. As an additional alternative, each of the peripheral devices associated with the computer system 200 may be included within the device itself such as is the case, for example, with a laptop, personal digital assistant or other device.

Stored in the memory 206 and executable by the processor 203 are a number of components including, for example, an operating system 223 and a power supply current calculator 226. In addition, various data files may be stored in the memory 206 and accessed by various systems executed by the processor 203 such as, for example, a voltage V(t) data file 229, a voltage $V_w(t)$ data file 233, and an impedance $Z_f$ data file 236. In addition, other systems and data files may be stored in the memory 206. The voltage V(t) data file 229 represents the voltage V(t) measured as discussed above. The voltage $V_w(t)$ data file 229 represents the voltage measured by the differential probe 123 across the terminal resistance $R_{TERM}$ as described above. In this respect, the voltage V(t) data file 229 and the voltage $V_w(t)$ data file 229 may be generated using appropriate data capture equipment and the differential probe 123 as discussed above and are stored in the memory 206 to be accessed by the power supply current calculator 223. Similarly, the impedance $Z_f$ data file 236 may be generated as described above and ultimately stored in the memory 206 to be accessed by the power supply current calculator 223.

The memory 206 is defined herein as both volatile and nonvolatile memory and data storage components. Volatile components are those that do not retain data values upon loss of power. Nonvolatile components are those that retain data upon a loss of power. Thus, the memory 206 may comprise, for example, random access memory (RAM), read-only memory (ROM), hard disk drives, floppy disks accessed via an associated floppy disk drive, compact discs accessed via a compact disc drive, magnetic tapes accessed via an appropriate tape drive, and/or other memory components, or a combination of any two or more of these memory components. In addition, the RAM may comprise, for example, static random access memory (SRAM), dynamic random access memory (DRAM), or magnetic random access memory (MRAM) and other such devices. The ROM may comprise, for example, a programmable read-only memory (PROM), an erasable programmable read-only memory (EPROM), an electrically erasable programmable read-only memory (EEPROM), or other like memory device.

In addition, the processor 203 may represent multiple processors and the memory 206 may represent multiple memories that operate in parallel. In such a case, the local interface 209 may be an appropriate network that facilitates communication between any two of the multiple processors, between any processor and any one of the memories, or between any two of the memories etc. The processor 203 may be of electrical, optical, or molecular construction, or of some other construction as can be appreciated by those with ordinary skill in the art.

The operating system 223 is executed to control the allocation and usage of hardware resources such as the memory, processing time and peripheral devices associated with the computer system 200. In this manner, the operating system 223 serves as the foundation on which applications depend as is generally known by those with ordinary skill in the art.

Figure 8:
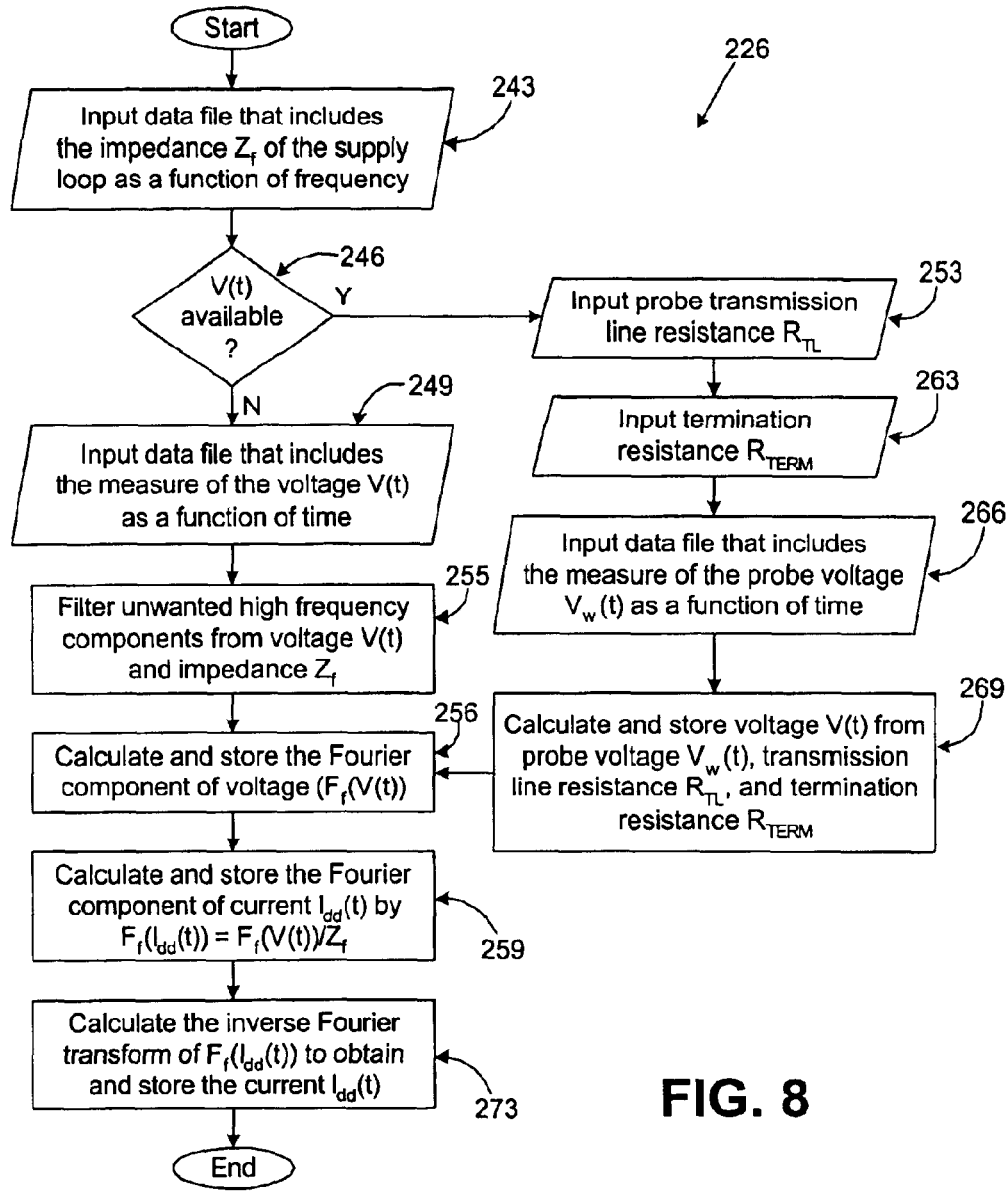
FIG. 8 is a flow chart that provides an example of the operation of a power supply current calculator executed in the computer system of FIG. 7.

Referring next to FIG. 8, shown is a flow chart that provides one example of the operation of the power supply current calculator 226 according to an embodiment of the present invention. Alternatively, the flow chart of FIG. 8 may be viewed as depicting steps of an example of a method implemented in the computer system 200 to obtain a measure of the current $I_{dd}(t)$ described above. The functionality of the power supply current calculator 226 as depicted by the example flow chart of FIG. 8 may be implemented, for example, in an object oriented design or in some other programming architecture. Assuming the functionality is implemented in an object oriented design, then each block represents functionality that may be implemented in one or more methods that are encapsulated in one or more objects. The power supply current calculator 226 may be implemented using any one of a number of programming languages such as, for example, C, C++, Assembly Language, or other programming languages.

Beginning with box 243, the power supply current calculator 226 inputs the data file that represents the impedance $Z_f(\omega)$ of the power supply loop. In this regard, the power supply current calculator 226 may generate, for example, a user interface on the display device 213 that facilitates a user designation of the impedance $Z_f(\omega)$ data file 236 that is stored in the memory 206 as containing the impedance $Z_f(\omega)$. Similarly, for all other input functions described hereafter, the power supply current calculator 226 may generate one or more user interfaces that facilitate a user entry of the desired data or a user entry that designates a predefined data file for use by the power supply current calculator 226.

Thereafter, the power supply current calculator 226 proceeds to box 246 in which it is determined whether the voltage V(t) data file 229 is available to be used in the determination of the current $I_{dd}(t)$. This may not be the case, for example, where the voltage $V_w(t)$ data file 233 has been generated due to the use of the termination resistance $R_{TERM}$ in conjunction with the differential probe 123 (FIG. 1) to minimize the reflections created by the differential probe 123. To determine if the voltage V(t) data file 229 is available, the power supply current calculator 226 may generate an appropriate user interface, for example, that facilitates a user specification as to whether the voltage V(t) data file 229 is available. If it is determined that the voltage V(t) data file 229 is not available in box 246, then the power supply current calculator 226 proceeds to box 249. Otherwise, the power supply current calculator 226 progresses to box 253.

In box 249, the power supply current calculator 226 inputs the voltage V(t) data file 229 that represents the measure of the voltage V(t) taken in situ as described above while the computer process runs on the die 109. Thereafter, in box 255 the power supply current calculator 226 filters unwanted high frequency components from the voltage V(t) and the impedance $Z_f(\omega)$. Alternatively, where the high frequency noise does not concern the user, box 255 may be skipped. The power supply current calculator 226 then proceeds to box 256 in which the Fourier transform of the voltage $F_f(V(t))$ is calculated and stored, for example, in the memory 206. Thereafter, the power supply current calculator 226 proceeds to box 259.

Assuming that the voltage V(t) data file 229 is not available in box 246, then in box 253 the power supply current calculator 226 inputs the transmission line resistance $R_{TL}$ of the differential probe 123. Next, in box 263, the power supply current calculator 226 inputs the termination resistance $R_{TERM}$. Next, in box 266 the power supply current calculator 226 inputs the voltage $V_w(t)$ data file 233 that represents the measure of the probe voltage $V_w(t)$ as discussed above. Thereafter, in box 269, the power supply current calculator 226 calculates the voltage V(t) from the probe voltage $V_w(t)$, the transmission line resistance $R_{TL}$, and the termination resistance $R_{TERM}$ using the equation $$V(t)=V_w(t)R_{TL}+R_{TERM})/R_{TERM}$$

or its mathematical equivalent. The result of the calculation performed in box 269 is stored, for example, in the memory 206 as the voltage V(t) data file 229. Thereafter, the power supply current calculator 226 proceeds to box 256.

Once the Fourier transform of the voltage $F_f(V(t))$ has been calculated in box 256, then in box 259, the Fourier component of the current $F_f(I_{dd}(t))$ is calculated using the equation $$F_f(I_{dd}(t))=F_f(V(t))/Z_f.$$

or its mathematical equivalent. The Fourier component of the current $F_f(I_{dd}(t))$ is stored, for example, in the memory 206. Then, box 273 the inverse Fourier transfer of the Fourier component of the current $F_f I_{dd}(t))$ is calculated, resulting in the current $I_{dd}(t)$. Thereafter, the power supply current calculator 226 ends as shown. The current $I_{dd}(t)$ is stored, for example, in the memory 206. Once the current $I_{dd}(t)$ is known, then a graph of the current $I_{dd}(t)$ may be rendered, for example, on a display device 213, a print medium, or other medium. Similarly, graphs of the voltage V(t), the probe voltage $V_w(t)$, the current $I_{dd}(t)$, and other data may be similarly rendered as is illustrated in FIGS. 36.

Although the power supply current calculator 226 is embodied in software or code executed by general purpose hardware as discussed above, as an alternative the power supply current calculator 226 may also be embodied in dedicated hardware or a combination of software/general purpose hardware and dedicated hardware. If embodied in dedicated hardware, the power supply current calculator 226 can be implemented as a circuit or state machine that employs any one of or a combination of a number of technologies. These technologies may include, but are not limited to, discrete logic circuits having logic gates for implementing various logic functions upon an application of one or more data signals, application specific integrated circuits having appropriate logic gates, programmable gate arrays (PGA), field programmable gate arrays (FPGA), or other components, etc. Such technologies are generally well known by those skilled in the art and, consequently, are not described in detail herein.

The flow chart of FIG. 8 shows one example of the architecture, functionality, and operation of an implementation of the power supply current calculator 226. If embodied in software, each block may represent a module, segment, or portion of code that comprises program instructions to implement the specified logical function(s). The program instructions may be embodied in the form of source code that comprises human-readable statements written in a programming language or machine code that comprises numerical instructions recognizable by a suitable execution system such as a processor in a computer system or other system. The machine code may be converted from the source code, etc. If embodied in hardware, each block may represent a circuit or a number of interconnected circuits to implement the specified logical function(s).

Although the flow chart of FIG. 8 shows a specific order of execution, it is understood that the order of execution may differ from that which is depicted. For example, the order of execution of two or more blocks may be scrambled relative to the order shown. Also, two or more blocks shown in succession in FIG. 8 may be executed concurrently or with partial concurrence. In addition, any number of counters, state variables, warning semaphores, or messages might be added to the logical flow described herein, for purposes of enhanced utility, accounting, performance measurement, or providing troubleshooting aids, etc. It is understood that all such variations are within the scope of the present invention.

Also, where the power supply current calculator 226 comprises software or code, it can be embodied in any computer-readable medium for use by or in connection with an instruction execution system such as, for example, a processor in a computer system or other system. In this sense, the logic may comprise, for example, statements including instructions and declarations that can be fetched from the computer-readable medium and executed by the instruction execution system. In the context of the present invention, a "computer-readable medium" can be any medium that can contain, store, or maintain the power supply current calculator 226 for use by or in connection with the instruction execution system. The computer readable medium can comprise any one of many physical media such as, for example, electronic, magnetic, optical, electromagnetic, infrared, or semiconductor media. More specific examples of a suitable computer-readable medium would include, but are not limited to, magnetic tapes, magnetic floppy diskettes, magnetic hard drives, or compact discs. Also, the computer-readable medium may be a random access memory (RAM) including, for example, static random access memory (SRAM) and dynamic random access memory (DRAM), or magnetic random access memory (MRAM). In addition, the computer-readable medium may be a read-only memory (ROM), a programmable read-only memory (PROM), an erasable programmable read-only memory (EPROM), an electrically erasable programmable read-only memory (EEPROM), or other type of memory device.

Although the invention is shown and described with respect to certain embodiments, it is obvious that equivalents and modifications will occur to others skilled in the art upon the reading and understanding of the specification. The present invention includes all such equivalents and modifications, and is limited only by the scope of the claims.

What is claimed is:

1. A method for measuring current, comprising:
   determining a voltage V(t) in situ at a power input of a die while running a computer process on the die;
   calculating a Fourier transform of the voltage $F_f(V(t))$ from the voltage calculating a current at the power input of the die in the frequency domain $(F_f(I_{dd}(t)))$ using the equation $$F_f(I_{dd}(t)) = \frac{F_f(V(t))}{Z_f},$$

where the impedance $Z_f$ comprises an impedance of a power supply loop coupled to the power input as a function of frequency; and
   determining the current $I_{dd}(t)$ at the power input of the die in the time domain by calculating the inverse Fourier transform of the current in the frequency domain $F_f(I_{dd}(t))$.

2. The method of claim 1 further comprising measuring the impedance $Z_f$ of the power supply loop as a function of frequency.

3. The method of claim 1, wherein determining the voltage V(t) in situ at the power input further comprises measuring the voltage V(t) by coupling a transmission line of a probe to a pair of test points associated with the power input, wherein the probe does not include a termination resistance coupled across the transmission line.

4. The method of claim 1, further comprising determining a termination resistance $R_{TERM}$ that is to be coupled across a transmission line between the power input of the die and an input of a probe to minimize an amount of reflection in the transmission line.

5. The method of claim 4, further comprising determining a transmission line resistance $R_{TL}$ associated with the transmission line.

6. The method of claim 5, further comprising measuring a probe voltage $V_w(t)$ taken across the terminal resistance $R_{TERM}$ in situ while running the computer process on the die.

7. The method of claim 6, wherein determining the voltage V(t) in situ at the power input further comprises calculating the voltage V(t) from the probe voltage $V_w(t)$, the termination resistance $R_{TERM}$, and the transmission line resistance $R_{TL}$.

8. The method of claim 7, wherein calculating the voltage V(t) from the probe voltage $V_w(t)$ is calculated according to the equation $$V(t) = V_w(t)(R_{TL} + R_{TERM})/R_{TERM}.$$

9. A program embodied in a computer readable medium for measuring current, comprising:
   code that calculates a Fourier transform of the voltage $F_f(V(t))$ from a voltage V(t) determined in situ at a power input of a die while running a computer process on the die;
   code that calculates a current at the power input in the frequency domain $(F_f(I_{dd}(t)))$ using the equation $$F_f(I_{dd}(t)) = \frac{F_f(V(t))}{Z_f},$$

where the impedance $Z_f$ comprises an impedance of a power supply loop coupled to the power input as a function of frequency; and
   code that determines a current at the power input of the die in the time domain $(I_{dd}(t))$ by calculating the inverse Fourier transform of the current in the frequency domain $F_f(I_{dd}(t))$.

10. The computer program embodied in the computer readable medium of claim 9, further comprises code that inputs an amount of data that represents the voltage V(t) measured in situ at the power input of the die while running the computer process on the die.

11. The computer program embodied in the computer readable medium of claim 9, further comprising code that inputs an amount of data that inputs an amount of data that represents the impedance $Z_f$ of the power supply loop as a function of frequency.

12. The computer program embodied in the computer readable medium of claim 9, further comprising:
   code that inputs a termination resistance across a transmission line between the power input of the die and an input of a probe employed to measure a probe voltage $V_w(t)$ taken across the terminal resistance $R_{TERM}$ in situ while running the computer process on the die; and
   code that inputs a transmission line resistance $R_{TL}$ associated with the transmission line.

13. The computer program embodied in the computer readable medium of claim 12, further comprising:

code that inputs an amount of data representing the probe voltage $V_w(t)$; and code that calculates the voltage $V(t)$ from the probe voltage $V_w(t)$, the terminal resistance $R_{TERM}$, and the transmission line resistance $R_{TL}$.

14. A system for measuring current, comprising:

a processor circuit having a processor and a memory;

a power supply current calculator stored in the memory and executable by the processor, the power supply current calculator comprising:

logic that calculates a Fourier transform of the voltage $F_f(V(t))$ from a voltage $V(t)$ determined in situ at a power input of a die while running a computer process on the die;

logic that calculates a current from the power supply in the frequency domain $(F_f(I_{dd}(t)))$ using the equation $$F_f(I_{dd}(t)) = \frac{F_f(V(t))}{Z_f},$$

where the impedance $Z_f$ comprises an impedance of a power supply loop coupled to the power input as a function of frequency; and logic that determines the current at the power input in the time domain $(I_{dd}(t))$ by calculating an inverse Fourier transform of the current in the frequency domain $F_f(I_{dd}(t))$ and that stores the current $I_{dd}(t)$ in the memory.

15. The system of claim 14, wherein the power supply current calculator further comprises logic that inputs an amount of data that represents the voltage $V(t)$ measured in situ at a power input of the die while running the computer process on the die.

16. The system of claim 14, wherein the power supply current calculator further comprises logic that inputs an amount of data that represents the impedance $Z_f$ of the power supply loop as a function of frequency.

17. The system of claim 14, wherein the power supply current calculator further comprises:

logic that inputs a termination resistance across a transmission line between the power input of the die and an input of a probe employed to measure a probe voltage $V_w(t)$ taken across the terminal resistance $R_{TERM}$ in situ while running the computer process on the die; and logic that inputs a transmission line resistance $R_{TL}$ associated with the transmission line.

18. The system of claim 17, wherein the power supply current calculator further comprises:

logic that inputs an amount of data representing the probe voltage $V_w(t)$; and logic that calculates the voltage $V(t)$ from the probe voltage $V_w(t)$, the terminal resistance $R_{TERM}$, and the transmission line resistance $R_{TL}$.

19. A system for measuring current, comprising:

means for calculating a Fourier transform of the voltage $F_f(V(t))$ from a voltage $V(t)$ determined in situ at a power input of a die while running a computer process on the die;

means for calculating a current at the power input of the die in the frequency domain $(F_f(I_{dd}(t)))$ using the equation $$F_f(I_{dd}(t)) = \frac{F_f(V(t))}{Z_f},$$

where the impedance $Z_f$ comprises an impedance of a power supply loop coupled to the power input as a function of frequency; and means for calculating the current $I_{dd}(t)$ at the power input of the die by calculating an inverse Fourier transform of the current in the frequency domain $F_f(I_{dd}(t))$.

* * * * *